(12) United States Patent
Chandra et al.

(10) Patent No.: US 10,862,232 B2
(45) Date of Patent: Dec. 8, 2020

(54) CIRCUIT BOARD PAD CONNECTOR SYSTEM

(71) Applicant: Dell Products L.P., Round Rock, TX (US)

(72) Inventors: Umesh Chandra, Santa Cruz, CA (US); Bhyrav M. Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 26 days.

(21) Appl. No.: 16/052,809

(22) Filed: Aug. 2, 2018

(65) Prior Publication Data

US 2020/0044372 A1 Feb. 6, 2020

(51) Int. Cl.
| | |
|---|---|
| *H01R 12/57* | (2011.01) |
| *H05K 1/18* | (2006.01) |
| *H05K 1/11* | (2006.01) |
| *H01R 43/20* | (2006.01) |

(52) U.S. Cl.
CPC ........... *H01R 12/57* (2013.01); *H01R 43/205* (2013.01); *H05K 1/111* (2013.01); *H05K 1/181* (2013.01); *H05K 2201/1031* (2013.01)

(58) Field of Classification Search
CPC .......... H05K 1/181; H05K 2201/1031; H05K 2201/1078; H05K 2201/10924; H05K 2201/10757; H05K 2201/10833; H05K 3/3426; H05K 1/111; H05K 3/4007; H05K 2201/09381; H05K 2201/09372; H05K 2201/0939; H05K 2201/10689; H05K 2201/10613; H05K 2201/10318; H01R 12/57

USPC ........................ 361/774, 306.1, 308.1, 308.3
See application file for complete search history.

(56) References Cited

U.S. PATENT DOCUMENTS

| | | | | |
|---|---|---|---|---|
| 4,772,762 A | * | 9/1988 | Fukino | H05K 1/111 174/261 |
| 4,942,400 A | * | 7/1990 | Tarzaiski | H05K 1/0216 174/261 |
| 5,428,505 A | * | 6/1995 | Sakemi | H05K 1/111 174/250 |
| 5,616,955 A | * | 4/1997 | Yamada | H01L 25/072 257/690 |
| 5,723,823 A | * | 3/1998 | Bell | H05K 1/0292 174/250 |

(Continued)

*Primary Examiner* — Steven T Sawyer
(74) *Attorney, Agent, or Firm* — Haynes and Boone, LLP

(57) ABSTRACT

A circuit board pad connector system includes a connector that is configured to mount to a connector pad that is included on a circuit board. The connector includes a connector lead frame. A lead portion is provided on the connector lead frame such that the lead portion is oriented substantially perpendicularly relative to the connector pad when the connector is mounted to the connector pad. A first mounting portion is provided on the connector lead frame, is configured to mount the connector to the connector pad, and extends in a first direction that is substantially perpendicular relative to the lead portion. A second mounting portion is provided on the connector lead frame, is configured to mount the connector to the connector pad, and extends in a second direction that is different than the first direction and that is substantially perpendicular relative to the lead portion.

13 Claims, 21 Drawing Sheets

(56) References Cited

U.S. PATENT DOCUMENTS

| | | | | |
|---|---|---|---|---|
| 6,295,709 | B1* | 10/2001 | Klein | H05K 3/225 |
| | | | | 228/177 |
| 6,972,494 | B1* | 12/2005 | Addinall | H01L 24/02 |
| | | | | 257/778 |
| 7,193,158 | B2* | 3/2007 | Yoshida | H05K 1/111 |
| | | | | 174/260 |
| 2002/0076952 | A1* | 6/2002 | Roy | H01L 23/49811 |
| | | | | 439/65 |
| 2006/0219430 | A1* | 10/2006 | Otani | H05K 1/111 |
| | | | | 174/260 |
| 2008/0142571 | A1* | 6/2008 | Yokozuka | H05K 1/144 |
| | | | | 228/110.1 |
| 2014/0008117 | A1* | 1/2014 | Huang | H05K 1/111 |
| | | | | 174/261 |
| 2016/0227648 | A1* | 8/2016 | Sawada | H05K 3/3426 |
| 2017/0318660 | A1* | 11/2017 | Roan | G01R 19/0092 |
| 2018/0263108 | A1* | 9/2018 | Tsukuda | H05K 1/181 |

\* cited by examiner

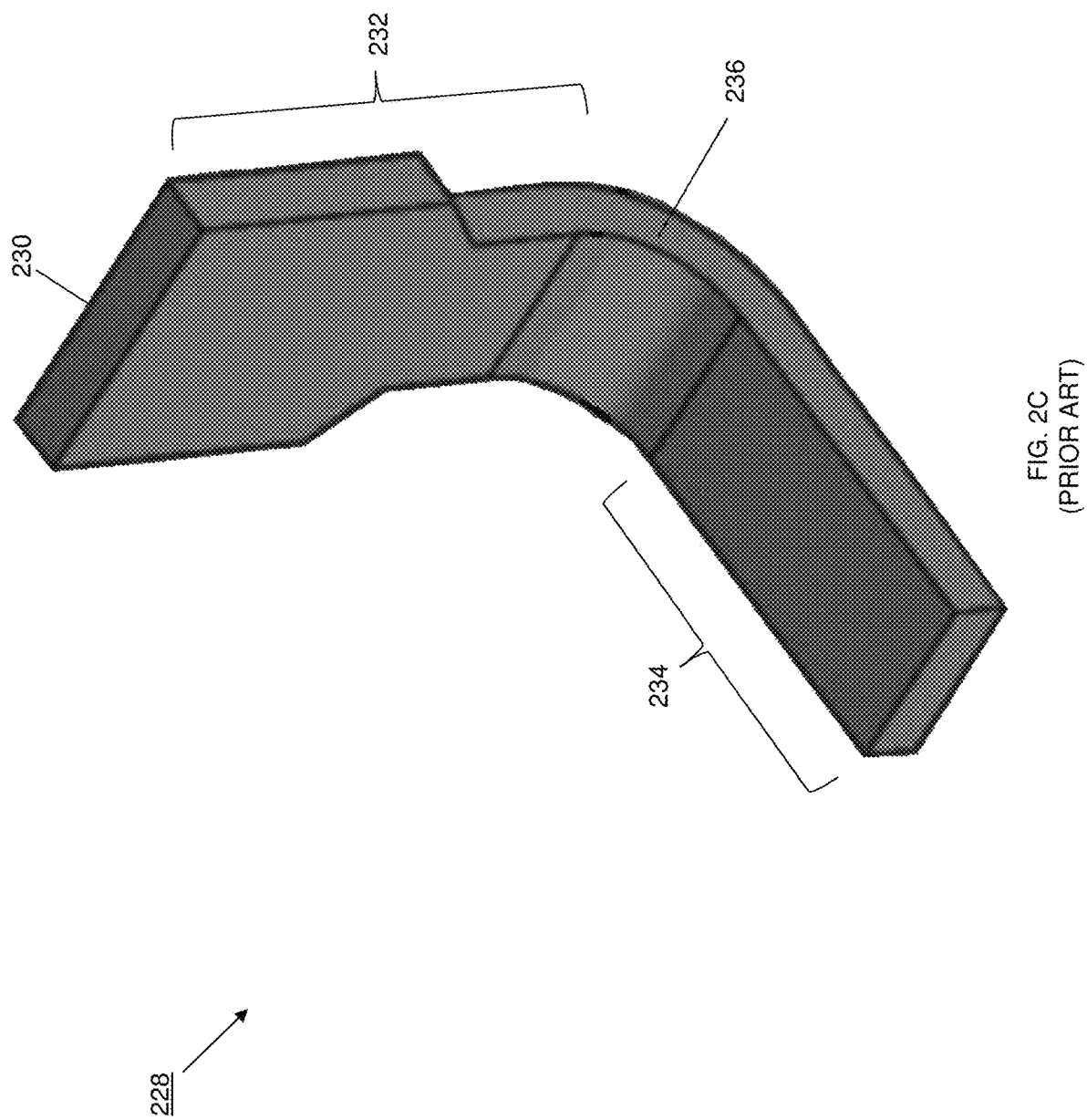

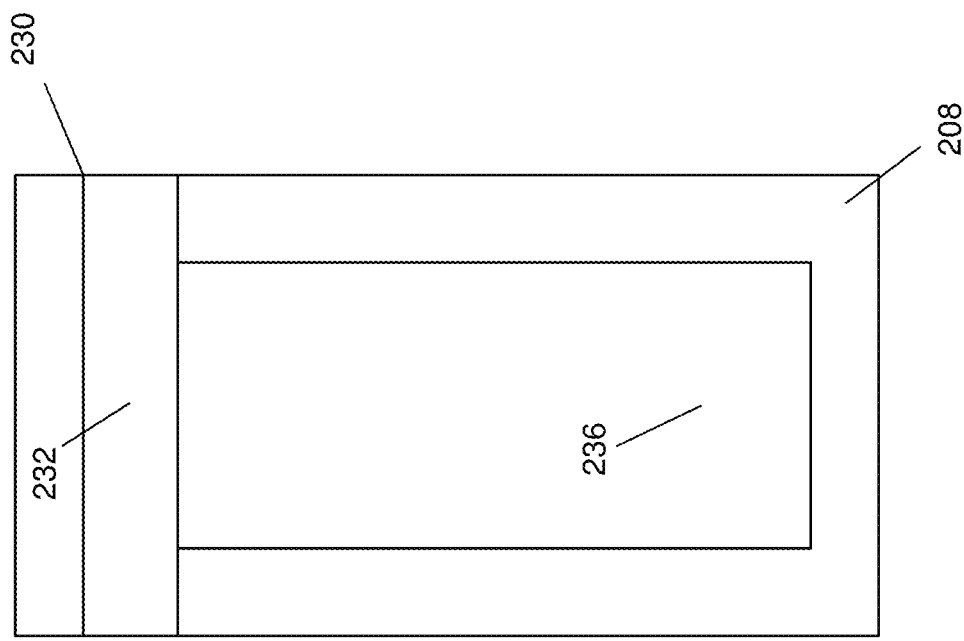

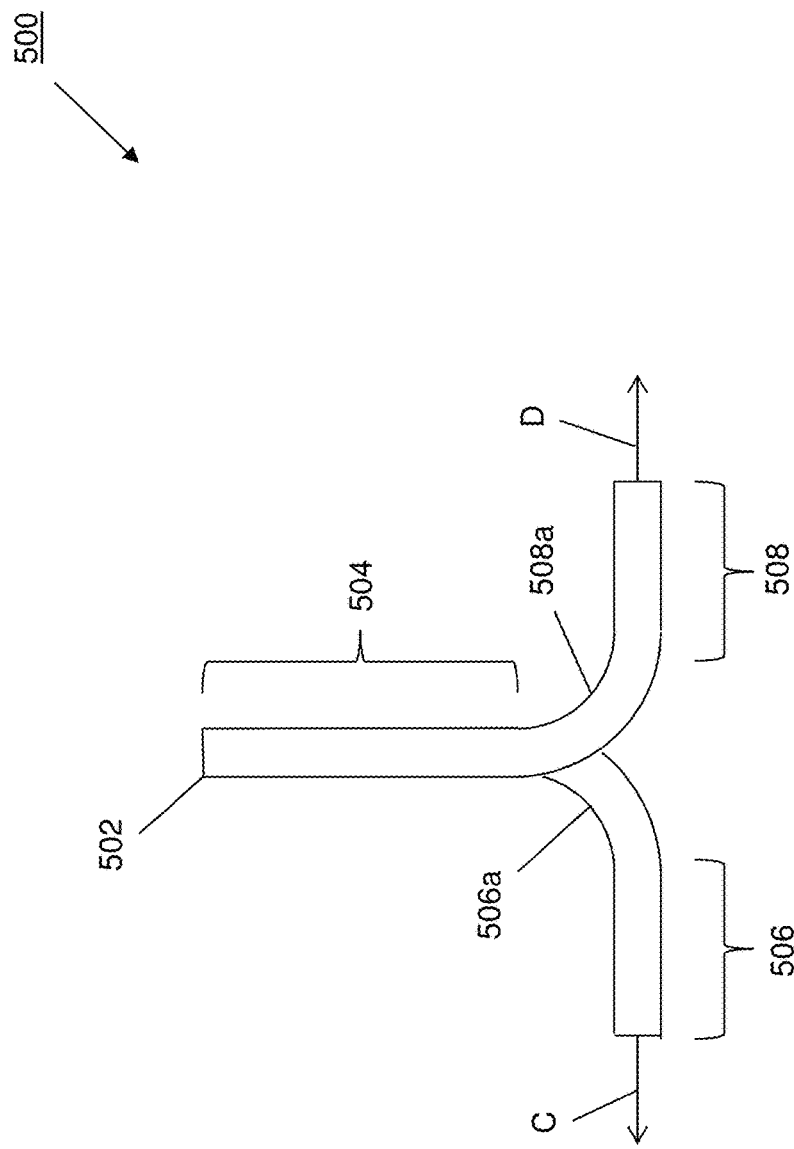

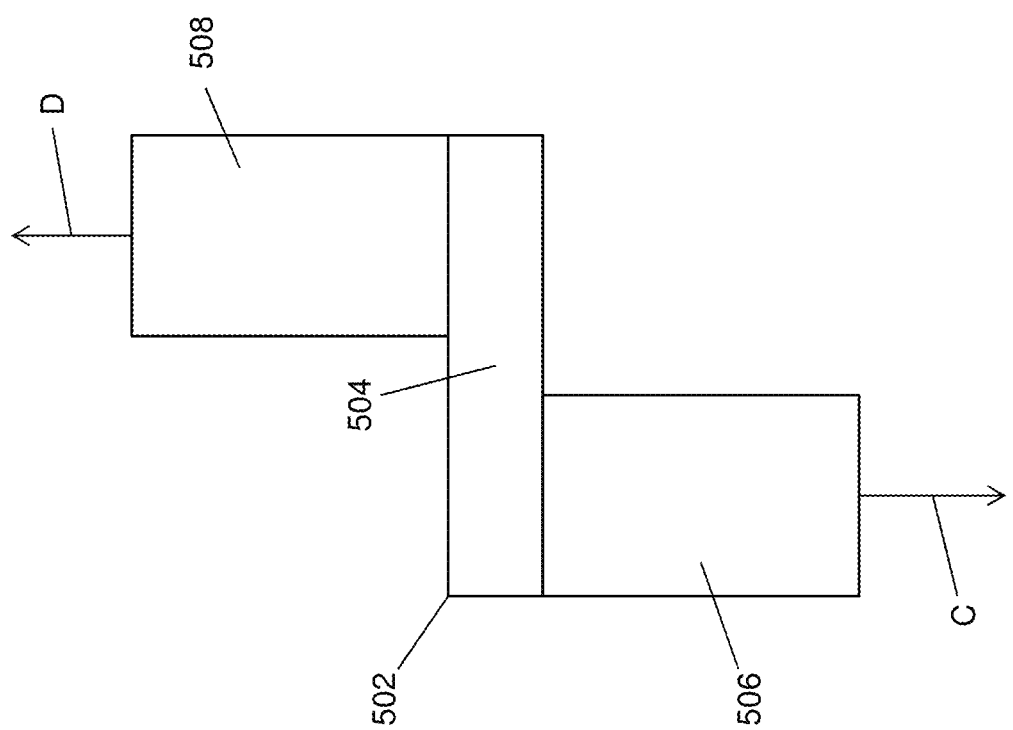

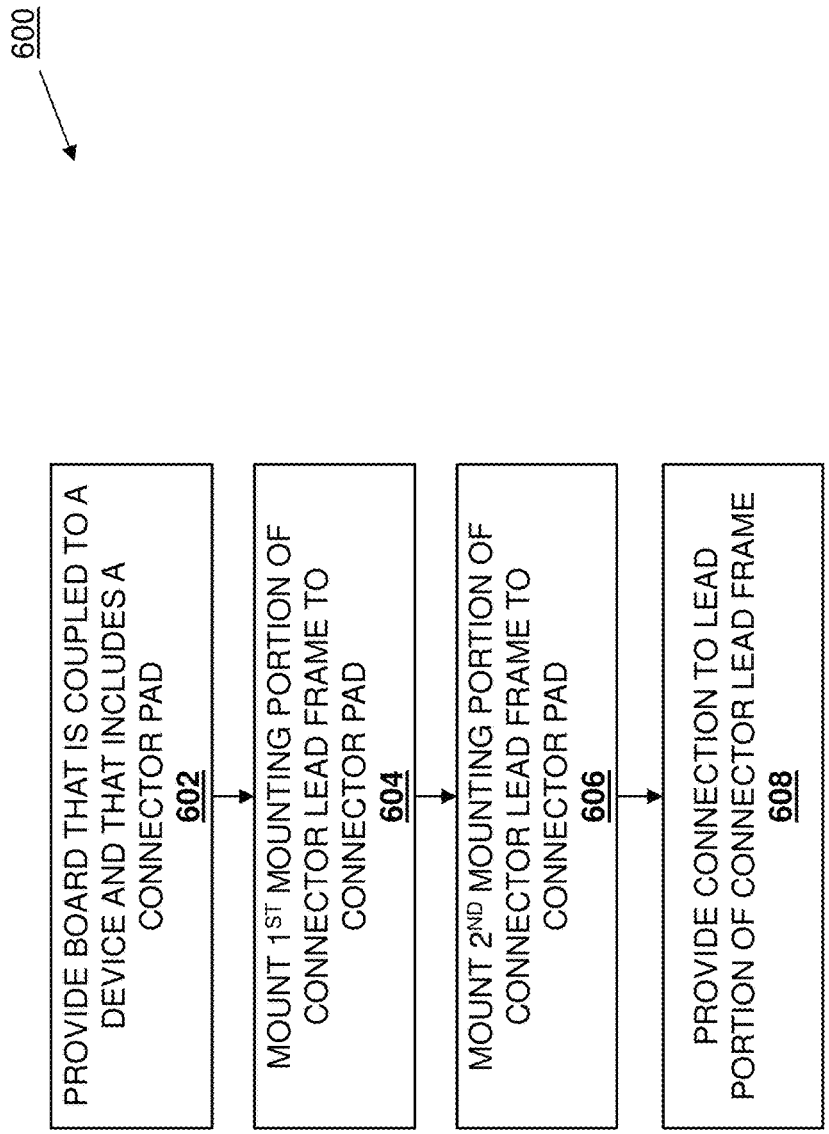

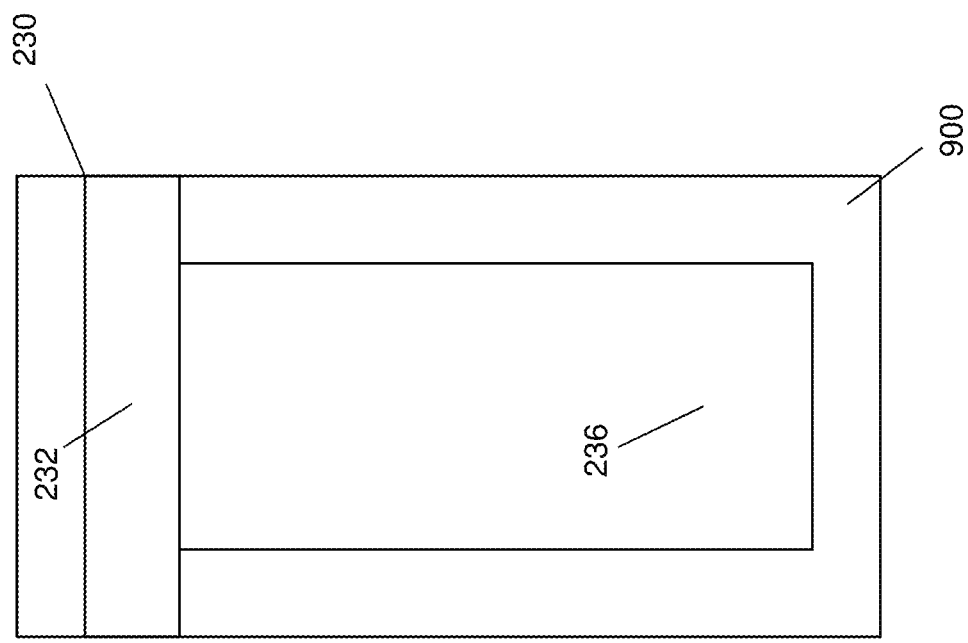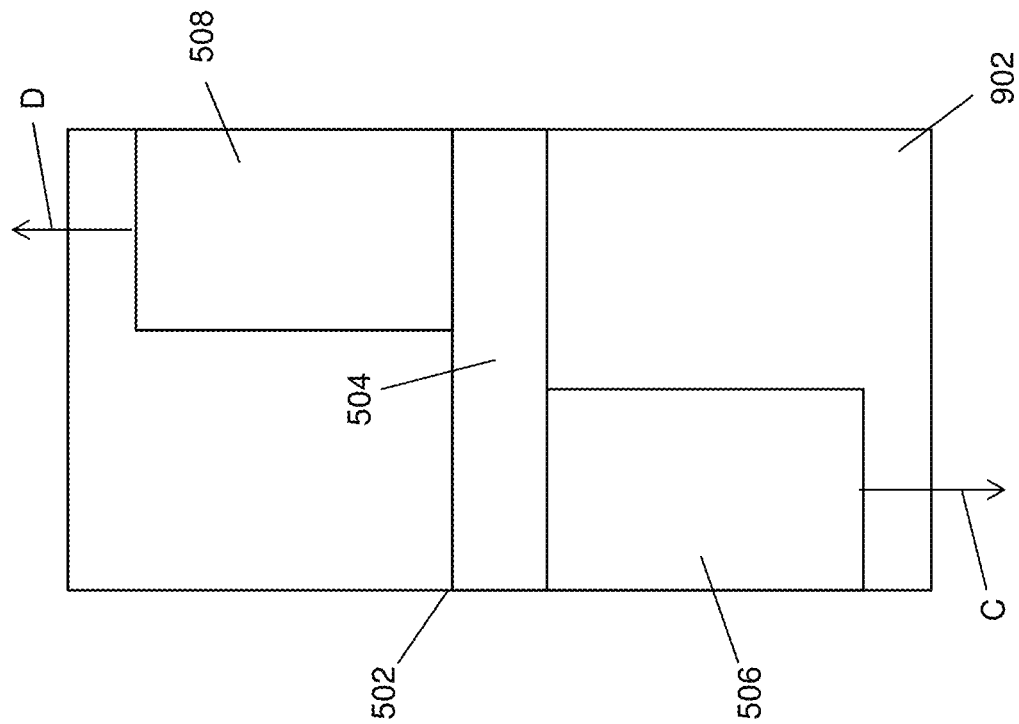
FIG. 9

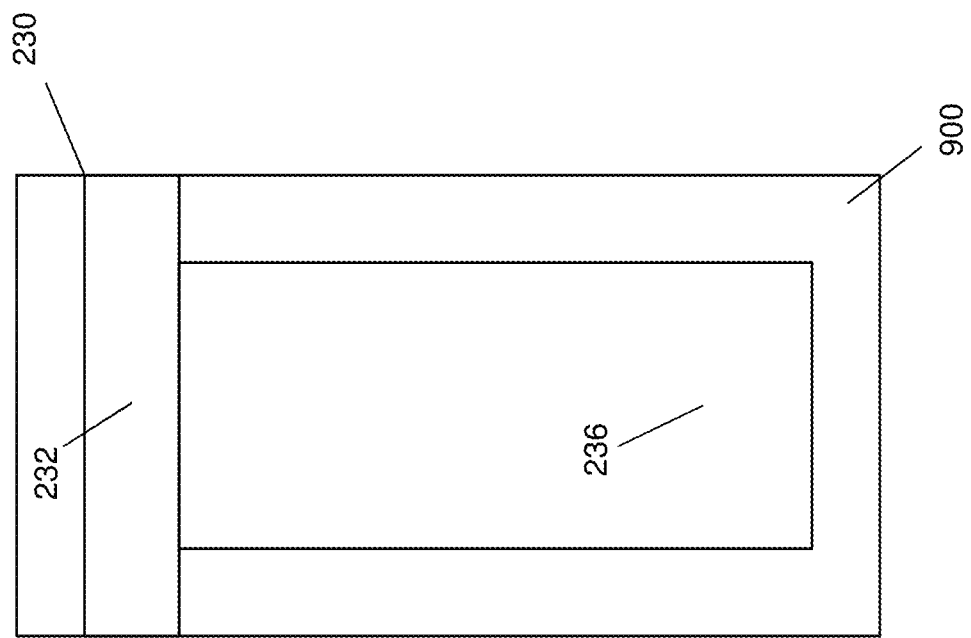
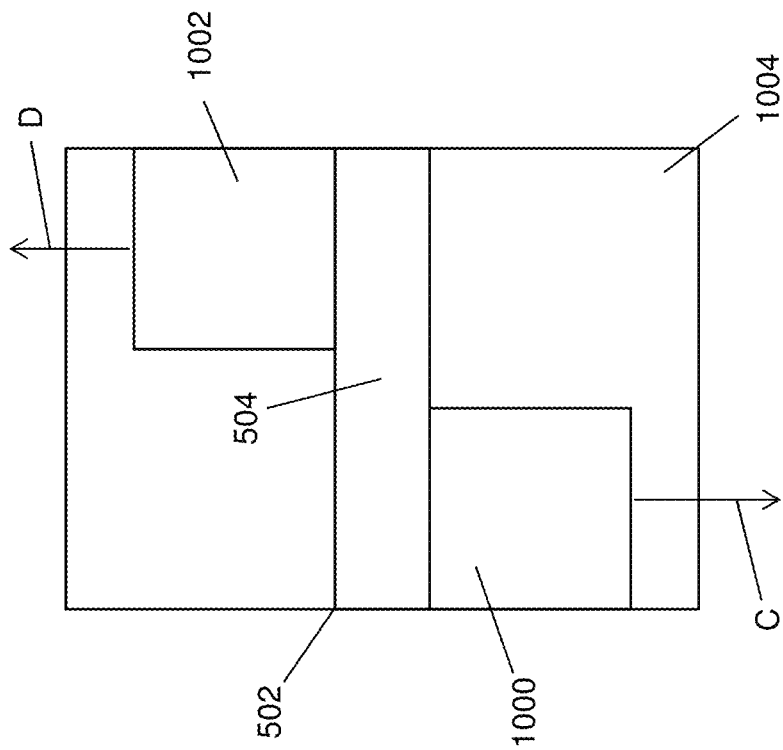
FIG. 10

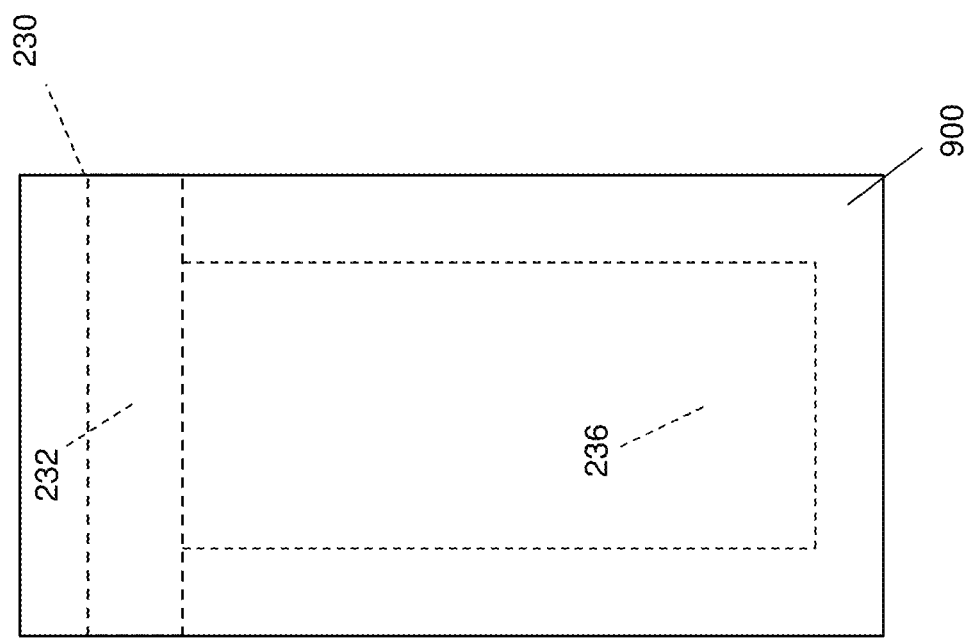
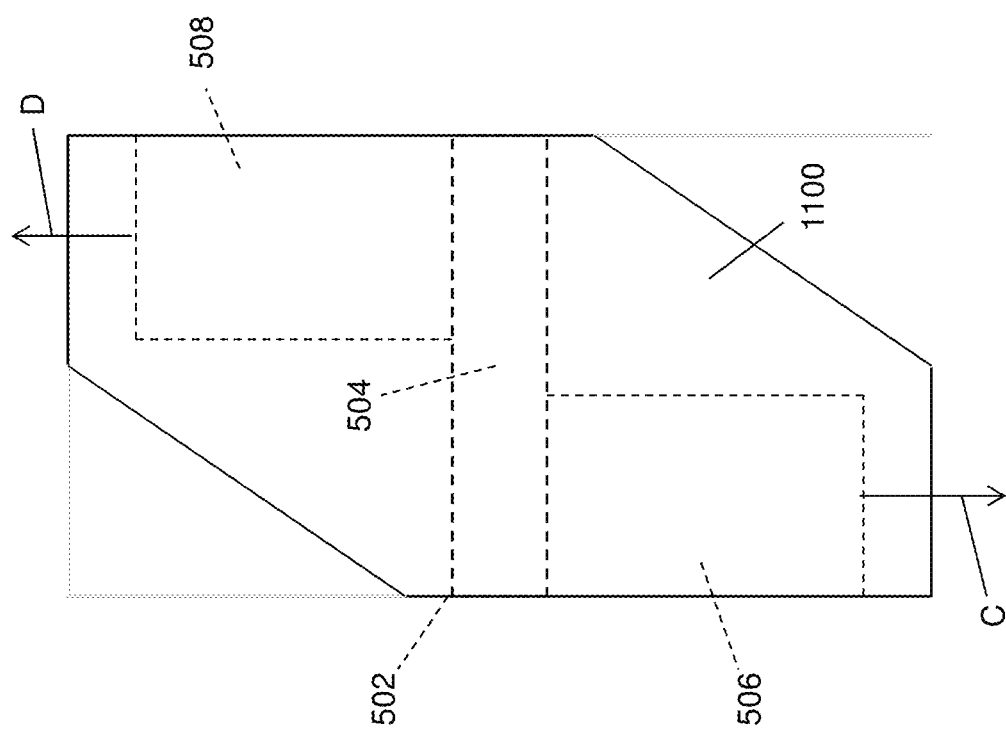
FIG. 11

CIRCUIT BOARD PAD CONNECTOR SYSTEM

BACKGROUND

The present disclosure relates generally to information handling systems, and more particularly to providing connections to circuit board pads in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems typically include circuit boards with connector pads that are utilized to mount connectors to the circuit board, and those connectors are then used to connect subsystems utilized with the information handling system via the circuit board. Furthermore, as data transmission speeds in information handling systems increase, connectors such as Surface Mount Technology (SMT) connectors tend to be the connectors of choice for relatively high speed signal applications due to their signal integrity benefits resulting from, for example, their enablement of back-drilling, shielding of ground vias, choice of desired signals, and ground via assignments. Conventionally, the orientation of the connectors when mounted to the connector pads has been unimportant. However, the inventors of the present disclosure have discovered that subtle parasitic effects can be introduced at relatively high data transmission speeds in response to particular connector mounting orientations. For example, depending on how the signal transmission line connects to the connector pad, the orientation of the connector mounted to the connector pad can result in the connector pad and/or a portion of the lead frame providing a signal transmission path that is "dangling", "unused", or otherwise "open", and that may act as a resonator (e.g., at quarter wavelengths) that can compromise the signal integrity of the resultant communication channel.

Accordingly, it would be desirable to provide an improved circuit board pad connector system

SUMMARY

According to one embodiment, an Information Handling System (IHS) includes a board; a device coupled to the board; a first connector pad that is located on the board and coupled to the device via the board; a connector that is mounted to the connector pad, wherein the connector includes: a connector lead frame; a lead portion that is provided on the connector lead frame such that the lead portion is oriented substantially perpendicularly relative to the first connector pad; a first mounting portion that mounts the connector to the first connector pad, wherein the first mounting portion is provided on the connector lead frame such that the first mounting portion extends in a first direction that is substantially perpendicular relative to the lead portion; and a second mounting portion that mounts the connector to the first connector pad, wherein the second mounting portion is provided on the connector lead frame such that the second mounting portion extends in a second direction that is different than the first direction and that is substantially perpendicular relative to the lead portion.

BRIEF DESCRIPTION OF THE DRAWINGS

FIG. 2C is a perspective view illustrating an embodiment of a conventional connector that is configured to provide a connection to the connector pad of FIG. 2B.

FIG. 2F is a schematic top view illustrating an embodiment of a conventional connector of FIG. 2C connected to the connector pad of FIG. 2B.

FIG. 5B is a schematic cross-sectional view illustrating an embodiment of the connector FIG. 5B is a schematic cross-sectional view illustrating an embodiment of the connector of FIG. 5A.

FIG. 5C is a schematic top view illustrating an embodiment of the connector FIG. 5B.

FIG. 6 is a flow chart illustrating an embodiment of a method for providing a connection to a circuit board pad.

FIG. 9 is a top view illustrating an embodiment of the conventional connector of FIG. 2C mounted to a conventional connector pad, and the connector of FIGS. 5A and 5B mounted to a conventional connector pad.

FIG. 10 is a top view illustrating an embodiment of the conventional connector of FIG. 2C mounted to conventional connector pad, and a connector according to the teachings of the present disclosure mounted to a connector pad enabled by the teachings of the present disclosure.

FIG. 11 is a top view illustrating an embodiment of the conventional connector of FIG. 2C mounted to a conventional connector pad, and the connector of FIGS. 5A and 5B mounted to a connector pad enabled by the teachings of the present disclosure.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
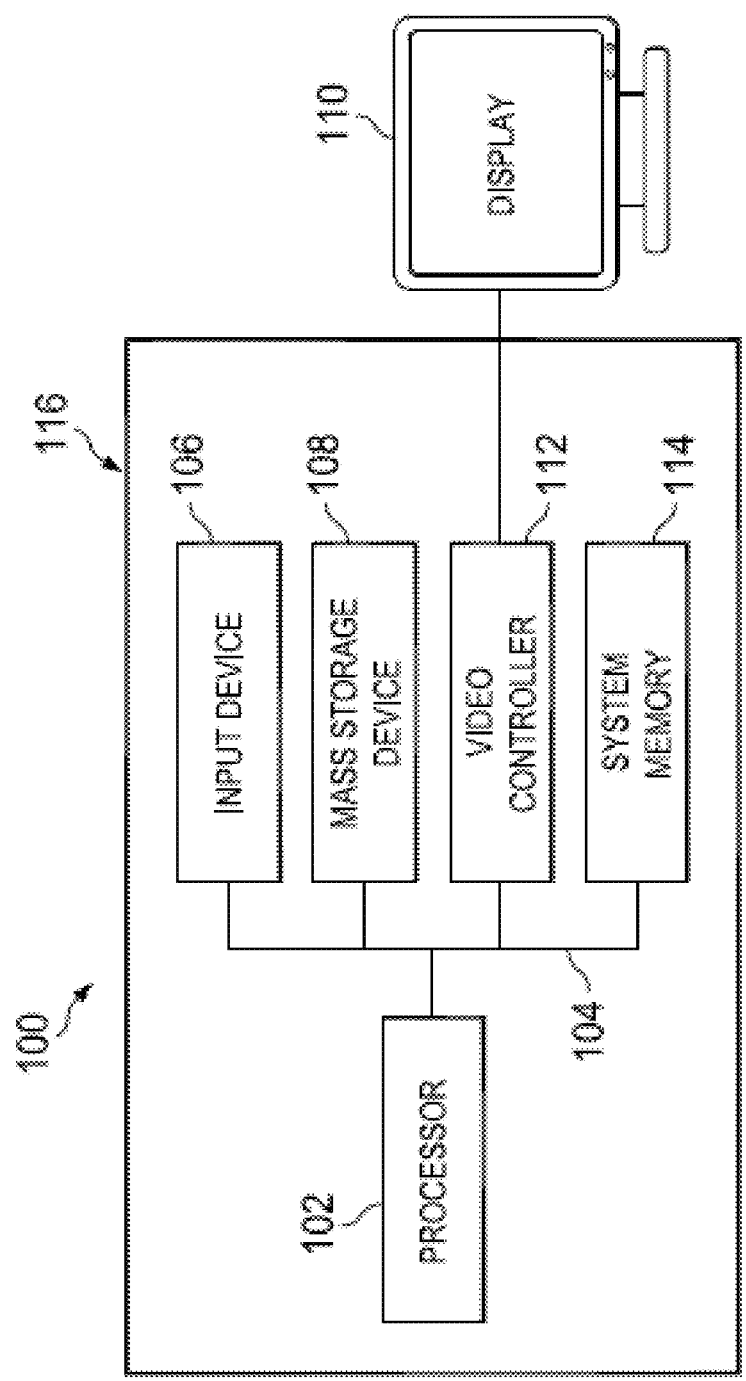
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
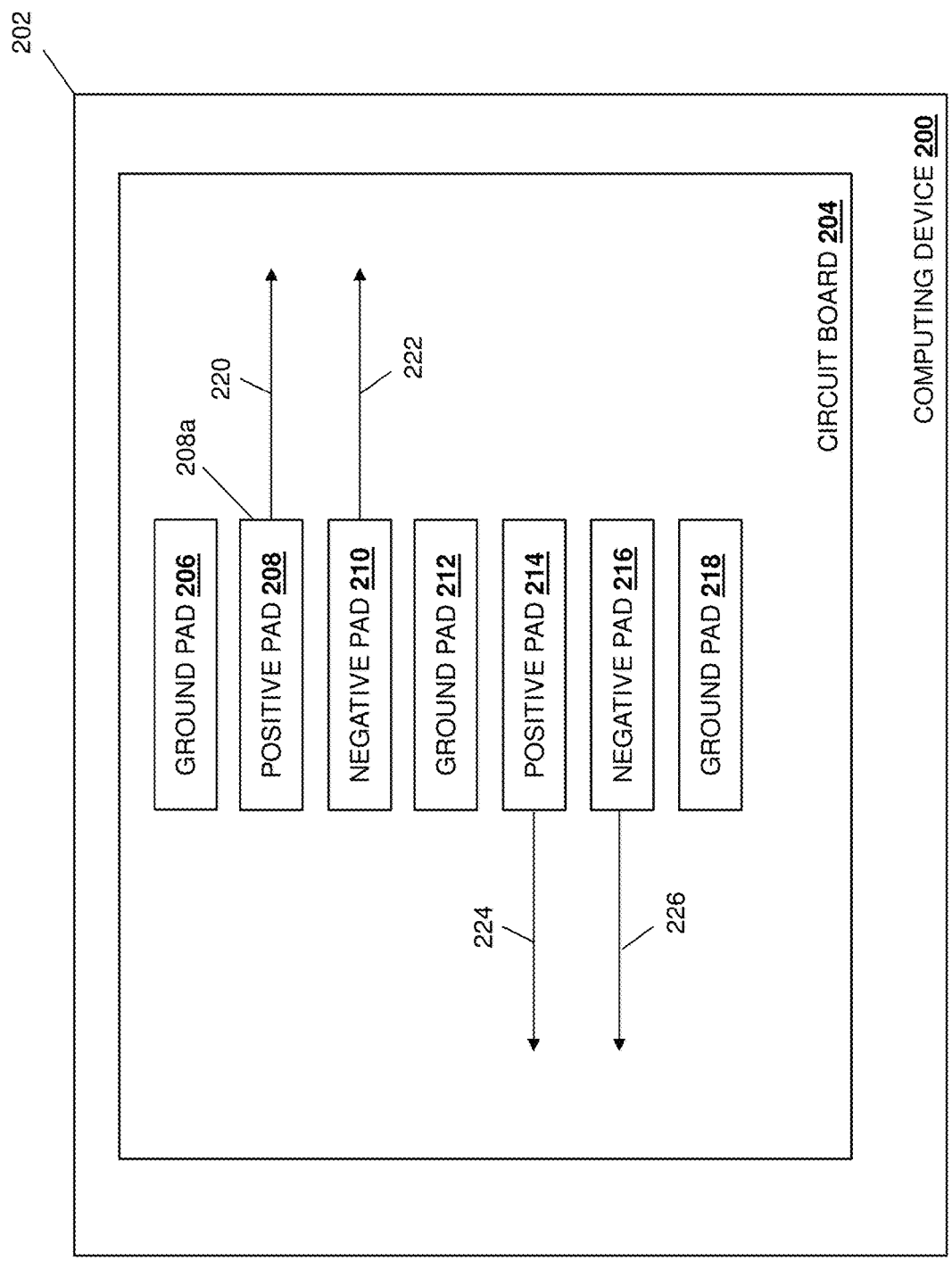
FIG. 2A is a schematic top view illustrating an embodiment of a computing device including a circuit board with connector pads.

Referring now to FIG. 2A, an embodiment of a conventional computing device 200 is illustrated that may be the IHS 100 discussed above with reference to FIG. 1, and/or may include some or all of the components of the IHS 100. In the illustrated embodiment, the computing device 200 includes a chassis 202 that houses the components of the computing device 200, only some of which are illustrated in FIG. 2A. In the embodiment of FIG. 2A, the chassis 202 is illustrated as housing a circuit board 204 including a plurality of connector pads such as, for example, the ground pad 206, the positive pad 208, the negative pad 210, the ground pad 212, the positive pad 214, the negative pad 216, and the ground pad 218 illustrated in FIG. 2A. The circuit board 204 may also include a plurality of signal transmission lines such as the signal transmission line 220 extending from positive pad 208, the signal transmission line 222 extending from negative pad 210, the signal transmission line 224 extending from positive pad 214, and the signal transmission line 226 extending from negative pad 216, as illustrated in FIG. 2A. One of skill in the art in possession of the present disclosure will recognize that, for the purposes of the discussion below, the signal transmission lines 220 and 222 are illustrated as extending from an opposite side of the pads 208 and 210, respectively, relative to the sides of the pads 214 and 216 from which the signal transmission lines 224 and 226 extend, and that signal transmission lines may extend from connector pads in a variety of locations that will fall within the scope of the present disclosure as well.

Figure 2B:
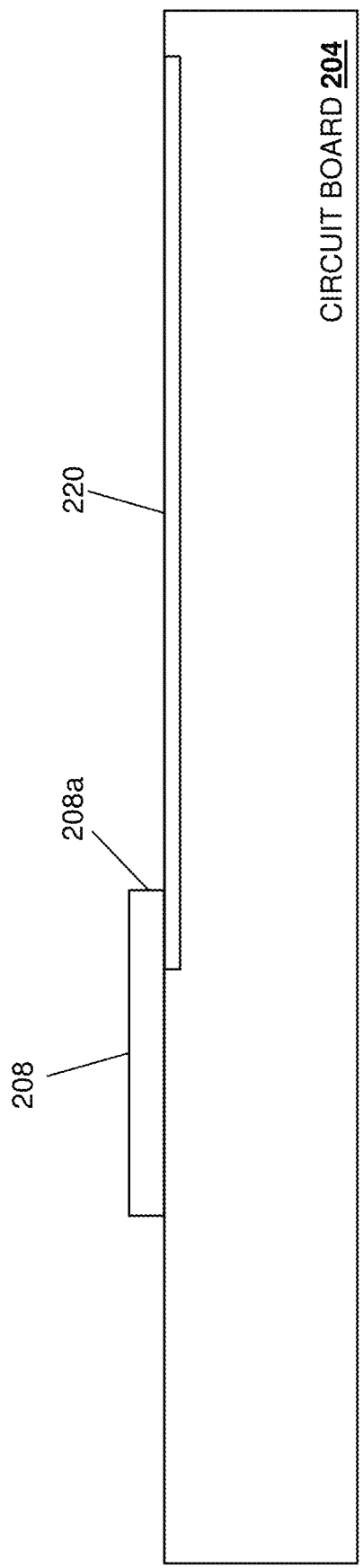
FIG. 2B is a schematic cross-sectional view illustrating an embodiment of a connector pad on the circuit board of FIG. 2A.

With reference to FIG. 2B, the positive pad 208 and signal transmission line 220 included on the circuit board 204 of FIG. 2A are illustrated in more detail. However, one of skill in the art in possession of the present disclosure will recognize that the pad and signal transmission line illustrated in FIG. 2B may be any of the negative pad 210/signal transmission line 222, the positive pad 214/signal transmission line 224, and/or the negative pad 216/signal transmission line 226 as well. As can be seen in FIG. 2B, the signal transmission line 220 extends through the circuit board 204, and is received by the positive pad 208 adjacent an end 208a of the positive pad 208. As discussed above, connectors and/or other coupling members may be mounted to the connector pads on the circuit board 204 in order to couple those coupling members to the signal transmission lines, and subsequently enable devices, components, and/or other computing device subsystems to be connected to those coupling members in order to provide for communication with other devices, components, and/or computing systems that are connected to the circuit board (e.g., via the signal transmission lines.)

With reference to FIG. 2C, an embodiment of a conventional connector 228 is illustrated. The conventional connector 228 is provided by a connector lead frame 230 having a lead portion 232 and a mounting portion 234 that are connected by an arcuate portion 236. One of skill in the art in possession of the present disclosure will recognize that the length of the mounting portion 236 of the connector lead frame 228 is typically provided to ensure a desired mechanical/structural strength with regard to the retention of the connector lead frame 228 on a connector pad, discussed below. In some examples, the conventional connector 228 is provided as part of a conventional Surface Mount Technology (SMT) connector. One of skill in the art in possession of the present disclosure will recognize that the connector lead frame 230 of the connector 228 is typically provided by a single piece of material that is provided with the configuration illustrated in FIG. 2C (e.g., bent to form the arcuate portion 236 between the lead portion 230 and the mounting portion 234) in order to provide a structurally robust connector lead frame at a relatively low cost. However, one of skill in the art will recognize that conventional connectors are provided with structures that differ from that illustrated in FIG. 2C (e.g., L-shaped connectors with a 90 degree transition between the lead portion and the mounting portion), and that suffer from the same issues discussed below.

Figure 2D:
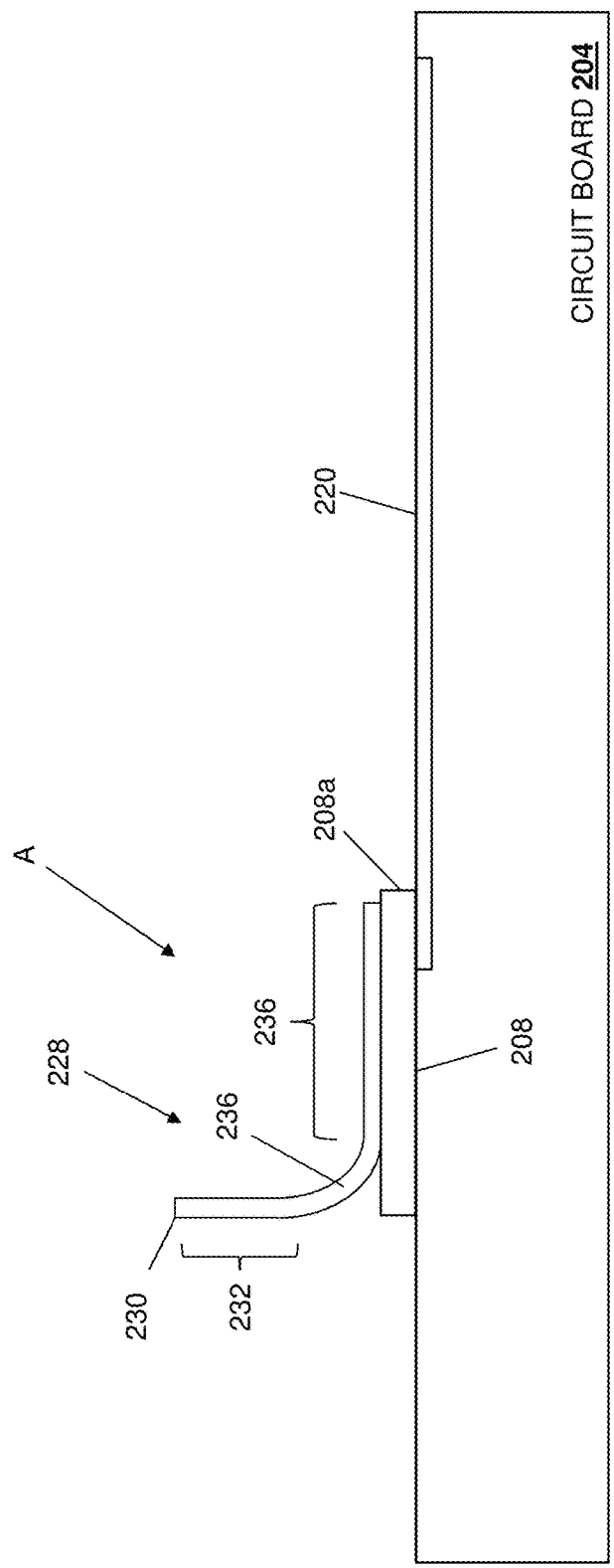
FIG. 2D is a schematic cross-sectional view illustrating an embodiment of the conventional connector of FIG. 2C connected to the connector pad of FIG. 2B in a first orientation.

For example, FIG. 2D illustrates how the conventional connector 228 may be mounted to the positive pad 208 in a first mounting orientation A. In the illustrated embodiment, a connector lead frame 230 that may be included on, for example, an SMT connector, includes the mounting portion 236 that engages the positive pad 208, and the lead portion 2232 that extend substantially perpendicularly from the mounting portion 228a. One of skill in the art will recognize that an SMT connector may include a variety of other SMT components connected to the connector lead frame 230, but those SMT components have been omitted for clarity. As can be seen, in the first mounting orientation A, the mounting portion 236 of the connector lead frame 230 is mounted to the positive pad 208 such that lead portion 232 is located opposite the positive pad 208 from the end 208a of the positive pad 208 that receives the signal transmission line 220.

Figure 2E:
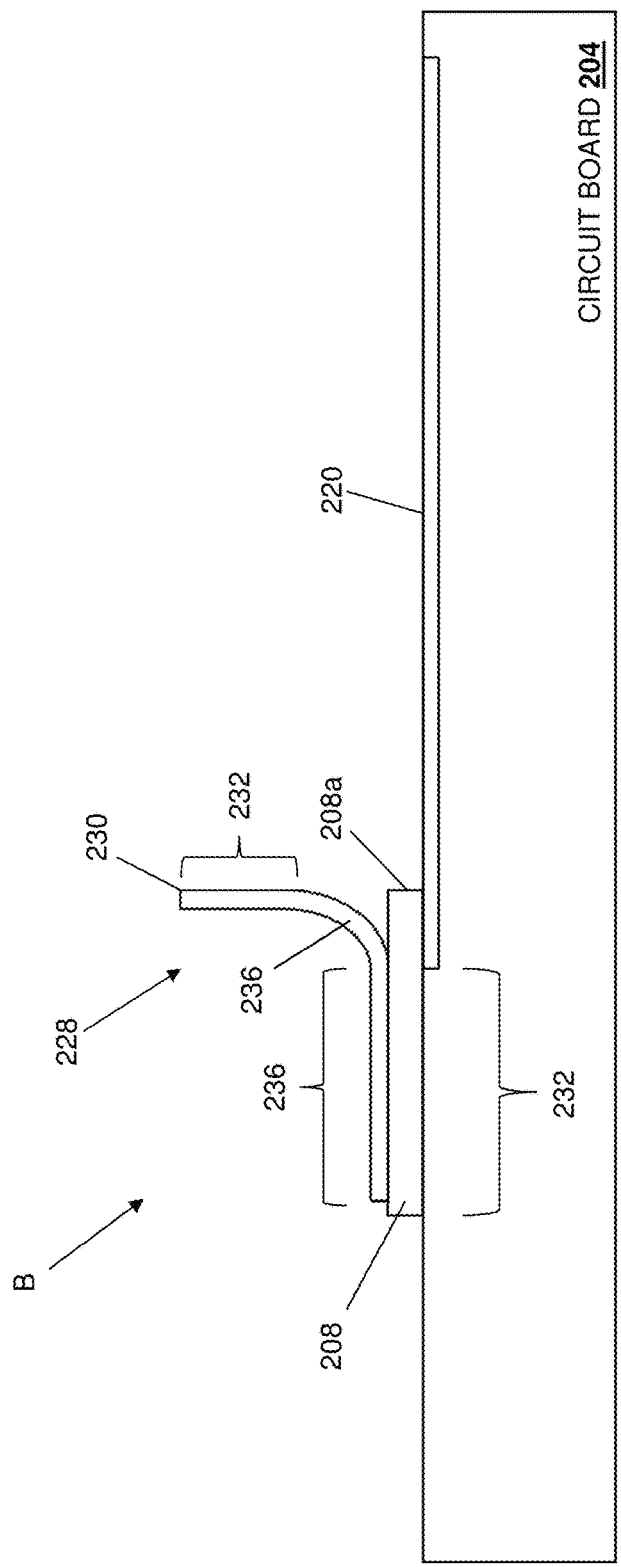
FIG. 2E is a schematic cross-sectional view illustrating an embodiment of the conventional connector of FIG. 2C connected to the connector pad of FIG. 2B in a second orientation.

Referring now to FIG. 2E, an example is illustrated of how the conventional connector 228 may be mounted to the positive pad 208 in a second mounting orientation B. As in the embodiment discussed above with reference to FIG. 2C, the connector lead frame 230 includes the mounting portion 236 that engages the positive pad 208, and the lead portion 232 that extend substantially perpendicularly from the mounting portion 228a. However, in the second mounting orientation B, the mounting portion 236 of the connector lead frame 230 is mounted to the positive pad 208 such that lead portion 230 is located adjacent the end 208a of the positive pad 208 that receives the signal transmission line 220. With reference to FIG. 2F, a top view of the connector lead frame 230 mounted to the connector pad 208 (in either of the orientations A and B) is illustrated for discussion below.

Figure 3A:
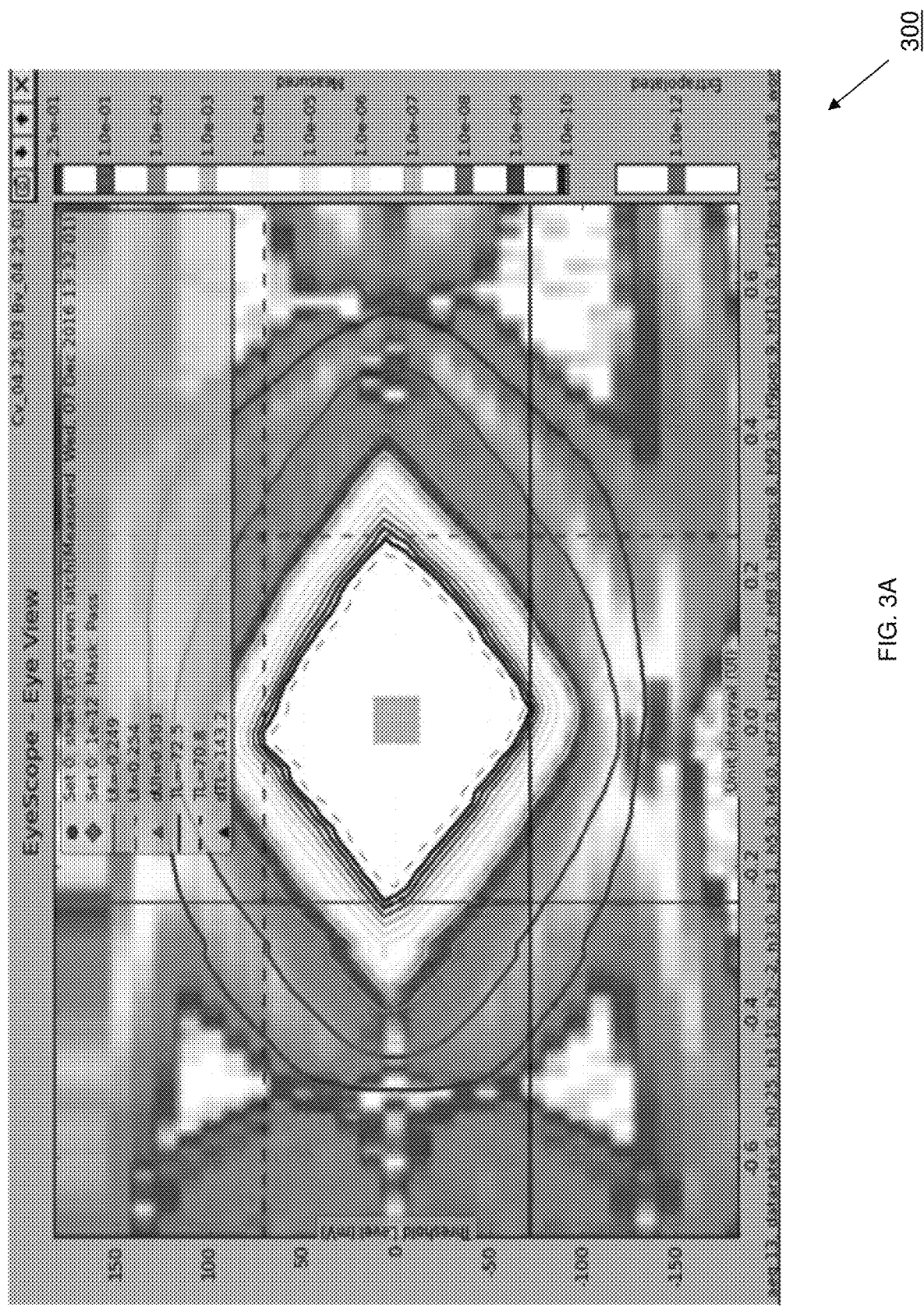
FIG. 3A is a chart illustrating an eye diagram for signals transmitted via the connector mounted to the connector pad in the first orientation of FIG. 2D.
Figure 3B:
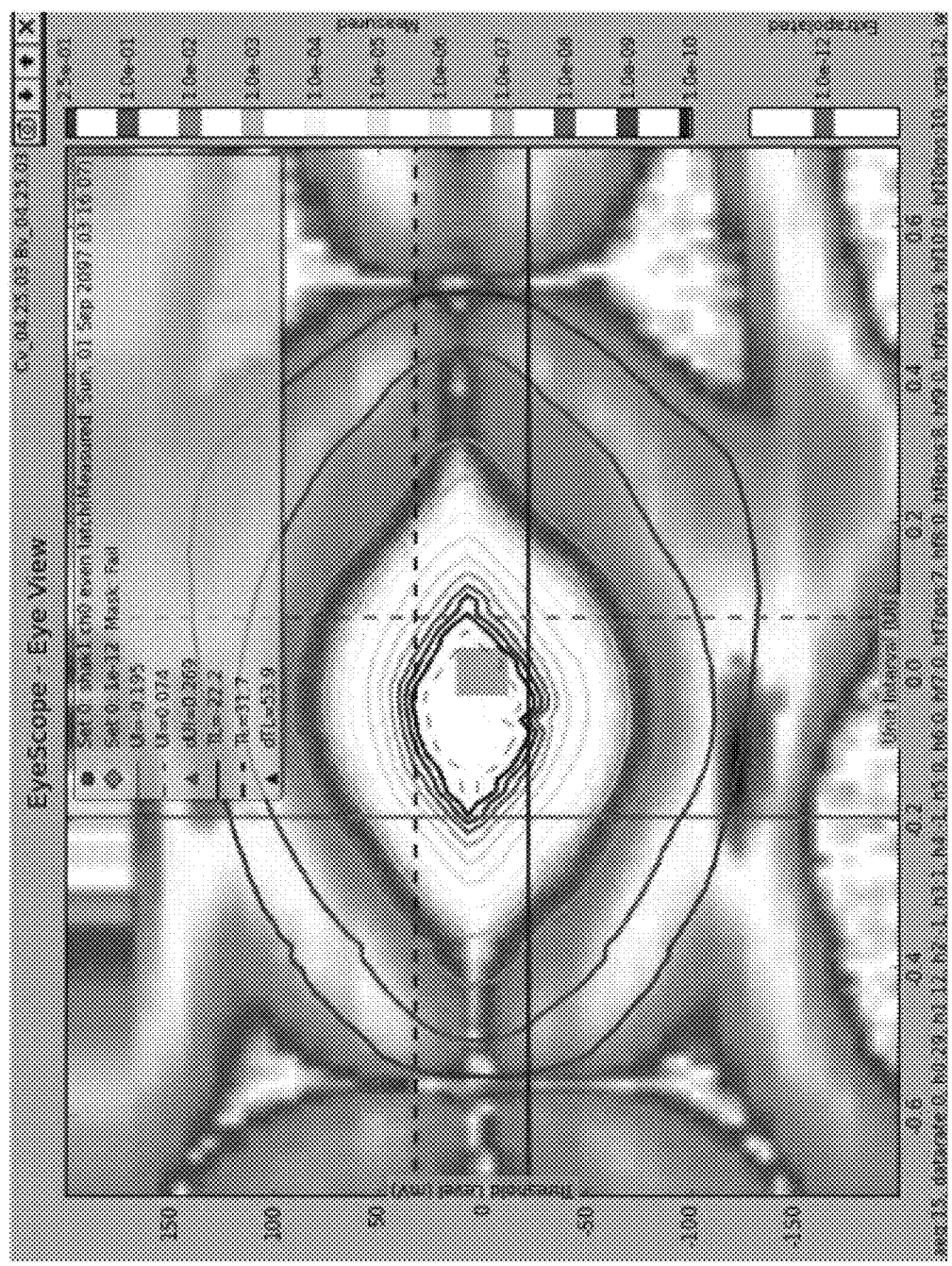
FIG. 3B is a chart illustrating an eye diagram for signals transmitted via the connector mounted to the connector pad in the second orientation of FIG. 2E.

Referring now to FIGS. 3A and 3B, eye diagrams are provided of signals transmitted using the connector/connector pad in the different mounting orientations illustrated in FIGS. 2D and 2E. Specifically, FIG. 3A illustrates an eye diagram 300 of signals provided via the connector lead frame 230 and positive pad 208 mounted in the first mounting orientation A of FIG. 2D, while FIG. 3B illustrates an eye diagram 302 of signals provided via the connector lead frame 230 and positive pad 208 mounted in the second mounting orientation C of FIG. 2E. One of skill in the art in possession of the present disclosure will appreciate that the eye diagram 300 is representative of a signal with superior characteristics relative to the signal represented by the eye diagram 302, and it has been found that the second mounting orientation B of the connector lead frame 230 to the positive pad 208 is responsible for those degraded signal characteristics. For example, with reference to FIG. 2E, it can be seen that the second mounting orientation B of the connector lead frame 230 to the positive pad 208 provides a portion of the positive pad 208 and the mounting portion 236 of the connector lead frame 230 that extend away from the end 208a of the positive pad 208, and which provide an open portion 232 of the signal transmission path that can resonate at high signal transmission speeds. In other words, high speed signals may be transmitted through the signal transmission line 220 to the positive pad 208, primarily through the portion of the positive pad 208 adjacent its end 208a, and then primarily through the arcuate portion 236/lead portion 232 of the connector lead frame 230. As such, the high speed signals may primarily bypass the open portion 232 of the transmission path that includes the remaining portion of the positive pad 208 and the mounting portion 236 of the connector lead frame 230, and that open portion 232 of the signal transmission path has been found to produce resonance that degrades high speed signals, as illustrated in the eye diagram 302.

Figure 4:
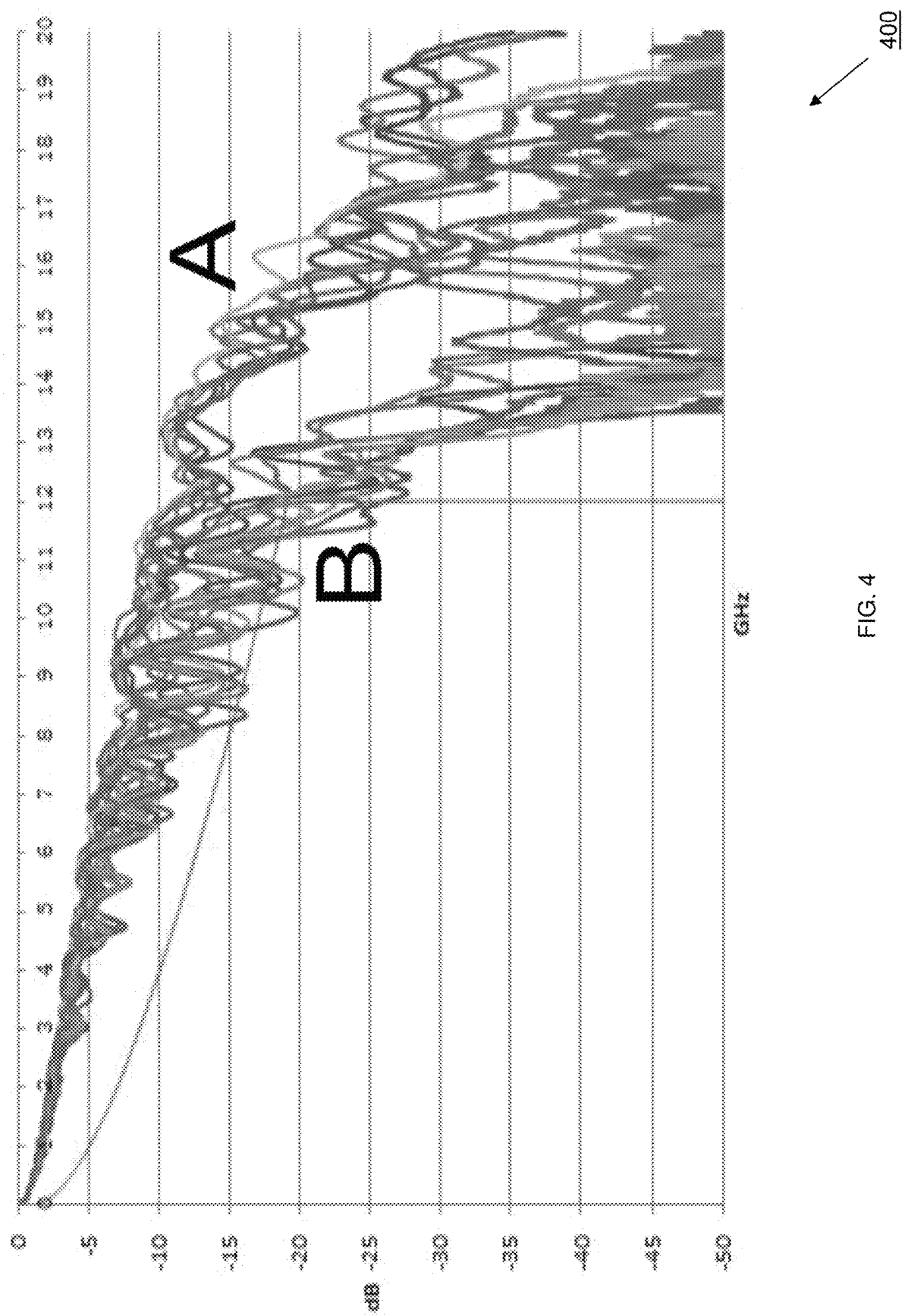
FIG. 4 is a chart illustrating insertion losses associated with the connector mounted to the connector pad in the first orientation of FIG. 2D, and the connector mounted to the connector pad in the second orientation of FIG. 2E.

Referring now to FIG. 4, a chart 400 of insertion losses is provided for signals transmitted using the connector/connector pad in the different mounting orientations illustrated in FIGS. 2D and 2E. Specifically, the insertion loss chart of FIG. 4 illustrates insertion losses for connectors 228 (marked as "A" in the chart) when mounted to the positive pad 208 the first mounting orientation A of FIG. 2D, as well as insertion losses for connectors 228 (marked as "B" in the chart) when mounted to the positive pad 208 the second mounting orientation B of FIG. 2E. In the experimental embodiment that produced the chart 400, the insertion losses marked as "A" were low enough to satisfy a signal specification, while the insertion losses marked as "B" violated that signal specification, and it has been found that the second mounting orientation B of the connector lead frame 230 to the positive pad 208 is responsible for those degraded signal characteristics. Similarly as described above, and with reference to FIG. 2E, it can be seen that the second mounting orientation B of the connector lead frame 230 to the positive pad 208 provides the portion of the positive pad 208 and the mounting portion 236 of the connector lead frame 230 that extend away from the end 208a of the positive pad 208, and which provide the open portion 232 of the signal transmission path that can resonate at high signal transmission speeds. In other words, high speed signals may be transmitted through the signal transmission line 220 to the positive pad 208, primarily through the portion of the positive pad 208 adjacent its end 208a, and then primarily through the arcuate portion 236/lead portion 232 of the connector lead frame 230. As such, the high speed signals may primarily bypass the open portion 232 of the signal transmission path that includes the remaining portion of the positive pad 208 and the mounting portion 236 of the connector lead frame 230, and that open portion 232 of the signal transmission path has been found to produce resonance that degrades high speed signals, as illustrated in by the insertion losses of the connectors marked "B" in the chart 400.

Figure 5A:
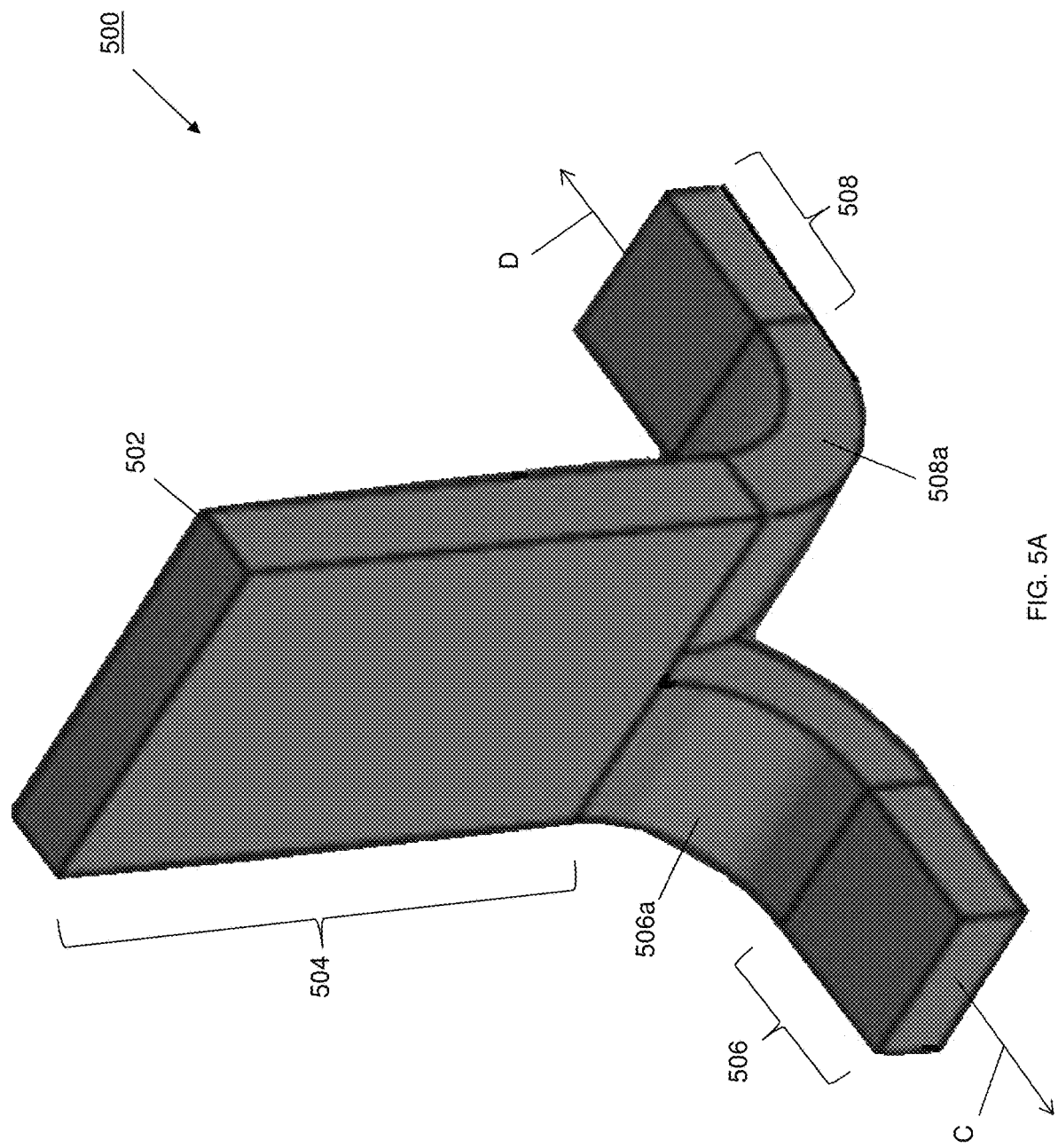
FIG. 5A is a perspective view illustrating an embodiment of a connector provided according to the teachings of the present disclosure, and that is configured to provide a connection to the connector pad of FIG. 2B.

Referring now to FIGS. 5A, 5B, and 5C, an embodiment of a connector 500 provided according to the teachings of the present disclosure is illustrated. The connector 500 is provided by a connector lead frame 502 having a lead portion 504. A first mounting portion 506 is connected to the lead portion 504 by an arcuate portion 506a, and extends from the arcuate protion 506a in a first direction C that is substantially perpendicular to the lead portion 504. A second mounting portion 508 is connected to the lead portion 504 by an arcuate portion 508a, and extends from the arcuate portion 508a in a second direction D that is substantially perpendicular to the lead portion 504. In the illustrated embodiment, the first direction and the second direction are substantially 180 degrees opposite each other, but one of skill in the art will recognize that the first mounting portion and the second mounting portion on the connector of the present disclosure may extend substantially perpendicularly from a lead portion in different directions that are oriented at other angles relative to each other as well. In a specific example, the connector 500 may be provided as part of a conventional Surface Mount Technology (SMT) connector, an AC cable, other cables, and/or other coupling system.

Figure 5D:
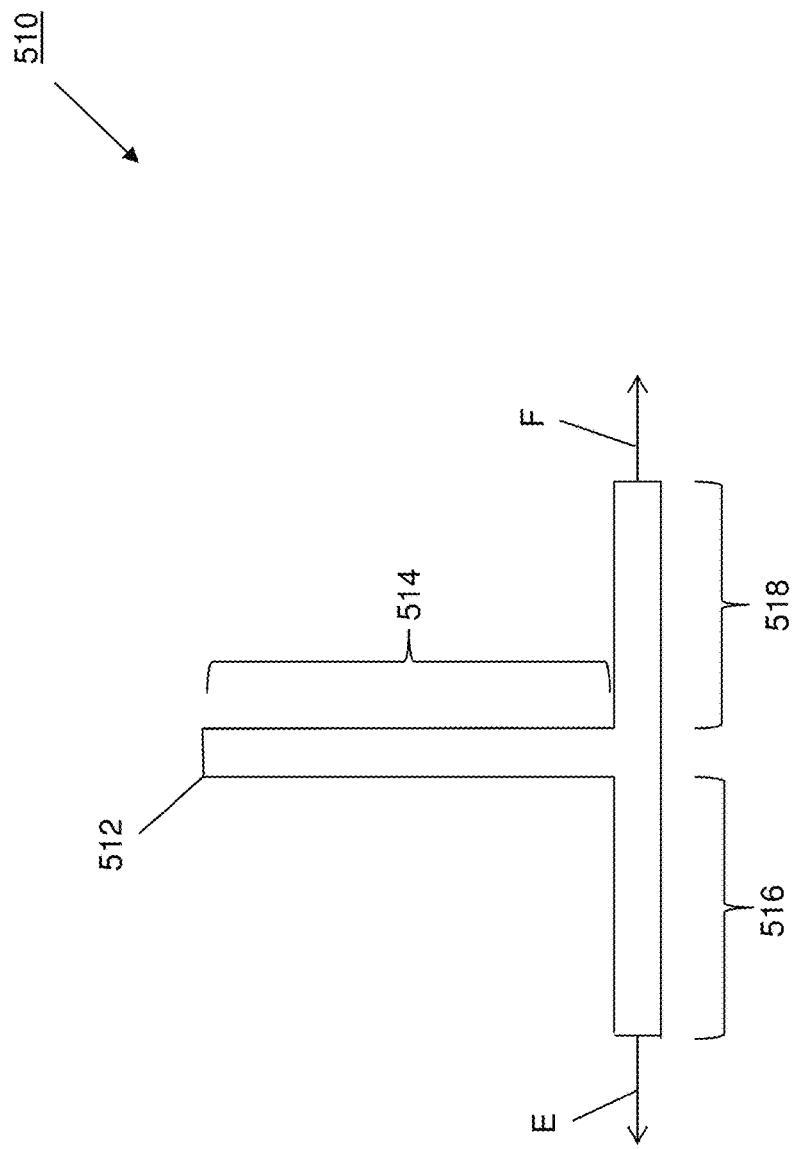
FIG. 5D is a schematic cross-sectional view illustrating an alternative embodiment of a connector provided according to the teachings of the present disclosure, and that is configured to provide a connection to the connector pad of FIG. 2B

One of skill in the art in possession of the present disclosure will recognize that the connector lead frame 502 of the connector 500 may be provided by a single piece of material that is provided with the configuration illustrated in FIGS. 5A, 5B, and 5C (e.g., cut and bent to form the arcuate portions 506a and 508a between the lead portion 230 and the mounting portions 506 and 508, respectively) in order to provide a structurally robust connector lead frame at a relatively low cost. However, one of skill in the art will recognize that connectors maybe provided with structures that differ from that illustrated in FIGS. 5A-C but that provide benefits similar to those discussed below. For example, FIG. 5D illustrates an alternative connector 510 provided according to the teachings of the present disclosure. The connector 510 is provided by a connector lead frame 512 having a lead portion 514. A first mounting portion 506 extends from the lead portion 504 in a first direction E that is substantially perpendicular to the lead portion 504. A second mounting portion 518 extends from the lead portion 504 in a second direction F that is substantially perpendicular to the lead portion 504. As such, the connector 510 differs from the connector 500 in that the arcuate portions 506a and 508a are omitted, and one of skill in the art in possession of the present disclosure will recognize that the connector 510 may provide similar benefits as the connector 500 described below.

Figure 5E:
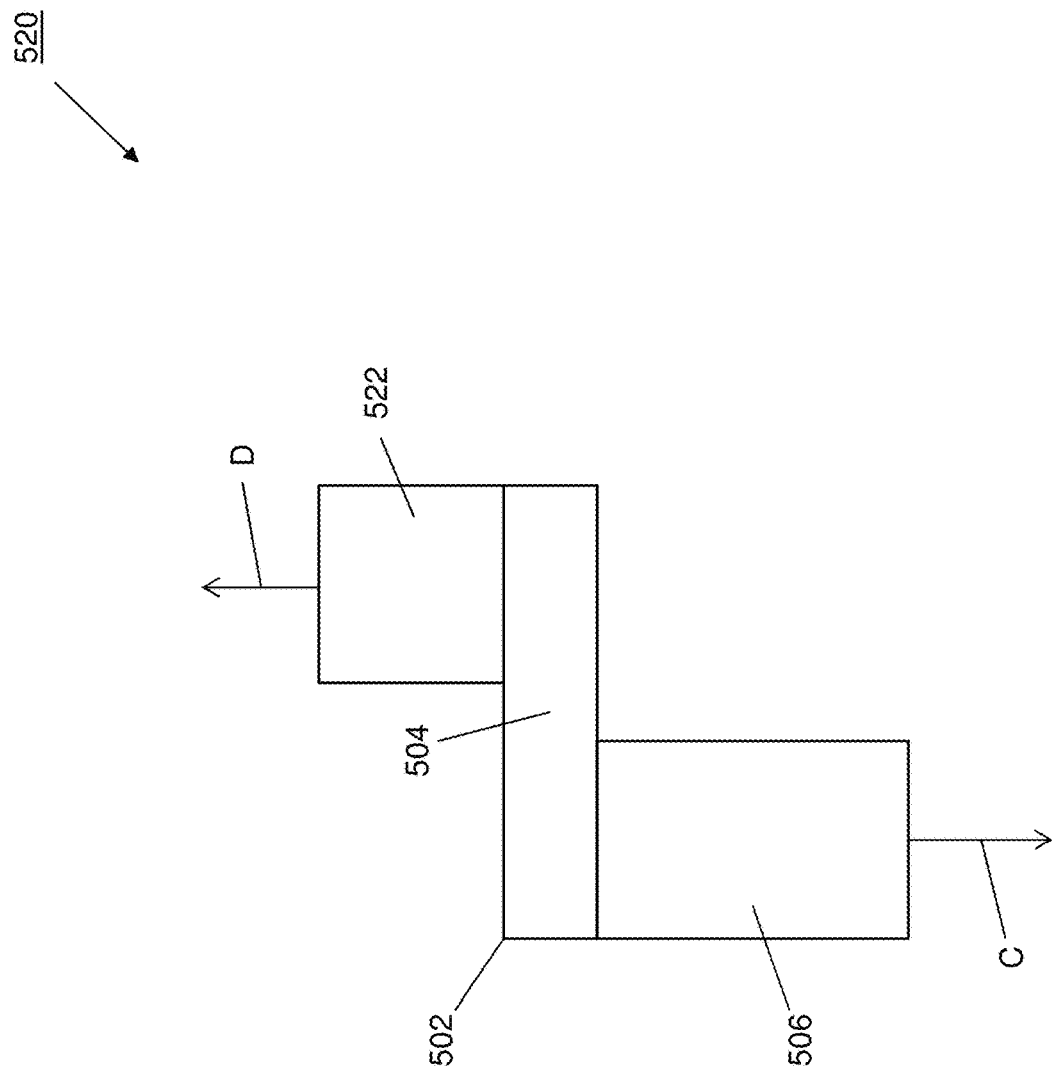
FIG. 5E is a schematic top view illustrating an alternative embodiment of a connector provided according to the teachings of the present disclosure.

In another example, FIG. 5D illustrates an alternative connector 520 that is similar to the connector 500 and, as such, element numbers for common components of the connectors 500 and 520 are used in FIG. 5E. The connector 520 differs from the connector 500 in that the second mounting portion 508 is replaced by a second mounting portion 522 that is shorter in length than the second mounting portion 508, but that still extends from the lead portion 504 in the second direction D that is substantially perpendicular to the lead portion 504. As such, one of skill in the art in possession of the present disclosure will recognize that the mounting portions on the connector 500 may be substantially the same length (which provides the symmetry that introduces at least some of the benefits discussed below), or may be different lengths than illustrated in FIGS. 5A, 5B, and 5C while still providing at least some of the benefits discussed below, and/or may include other configuration changes that will fall within the scope of the present disclosure as well.

Referring now to FIG. 6, an embodiment of method 600 for providing a connection to a circuit board pad is illustrated. As discussed below, the systems and methods of the present disclosure provide a connector that may be mounted to a connector pad in any of a plurality of orientations without regard to the side of the connector pad from which the signal transmission line extends, and without creating an open portion of a signal transmission path that is "dangling", "unused", or otherwise "open" such that that open portion of the signal transmission path acts as a resonator that compromises the signal integrity of the communication channel created by that connector/connector pad. In some embodiments, the connector of the present disclosure is provided by a connector lead frame having a lead portion that is substantially perpendicular to first and second mounting portions on the connector lead frame, which extend in substantially opposite directions to each other. The mounting portions of the connector lead frame are configured to mount the connector lead frame to the connector pad, and provide mechanical/structure retention that is comparable to that provided by a conventional mounting portion on a conventional connector lead frame\, while reducing the length of a possible open portion of the signal transmission path discussed above to prevent the generation of resonance that reduces signal integrity. In some embodiments, the reduction in length of the first and second mounting portions of the connector lead frame of the present disclosure (i.e., relative to a conventional mounting portion on a connector lead frame) allows for corresponding reductions in the area needed for the connector pad, thus providing for efficiencies in circuit board manufacture and cost as well.

The method 600 begins at block 602 where a board is provided that is coupled to a device and that includes a connector pad. In an embodiment at block 602, the circuit board 204 for the computing device 200 may be provided with the connector pads discussed above with reference to FIGS. 2A and 2B. In the specific example illustrated in FIG. 7, the connector pad 208 is illustrated as coupled via the signal transmission line 220 to a device 700, while in the specific example illustrated in FIG. 8 the connector pad 214 is illustrated as coupled via the signal transmission line 224 to a device 800. While a few specific examples are provided, one of skill in the art in possession of the present disclosure will recognize that a variety of boards may be provided that are coupled to a device and that include a connector pad while remaining within the scope of the present disclosure as well.

Figure 7:
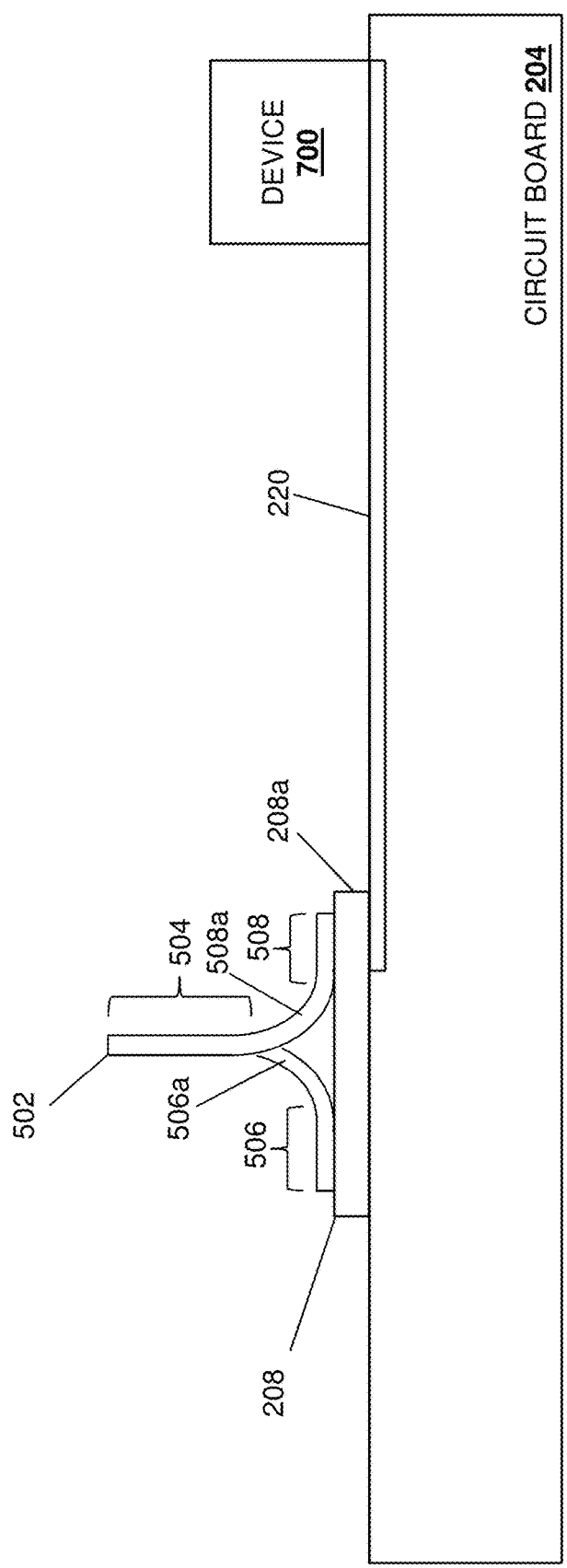
FIG. 7 is a schematic cross-sectional view illustrating an embodiment of the connector of FIGS. 5A and 5B mounted to the connector pad of FIG. 2B.
Figure 8:
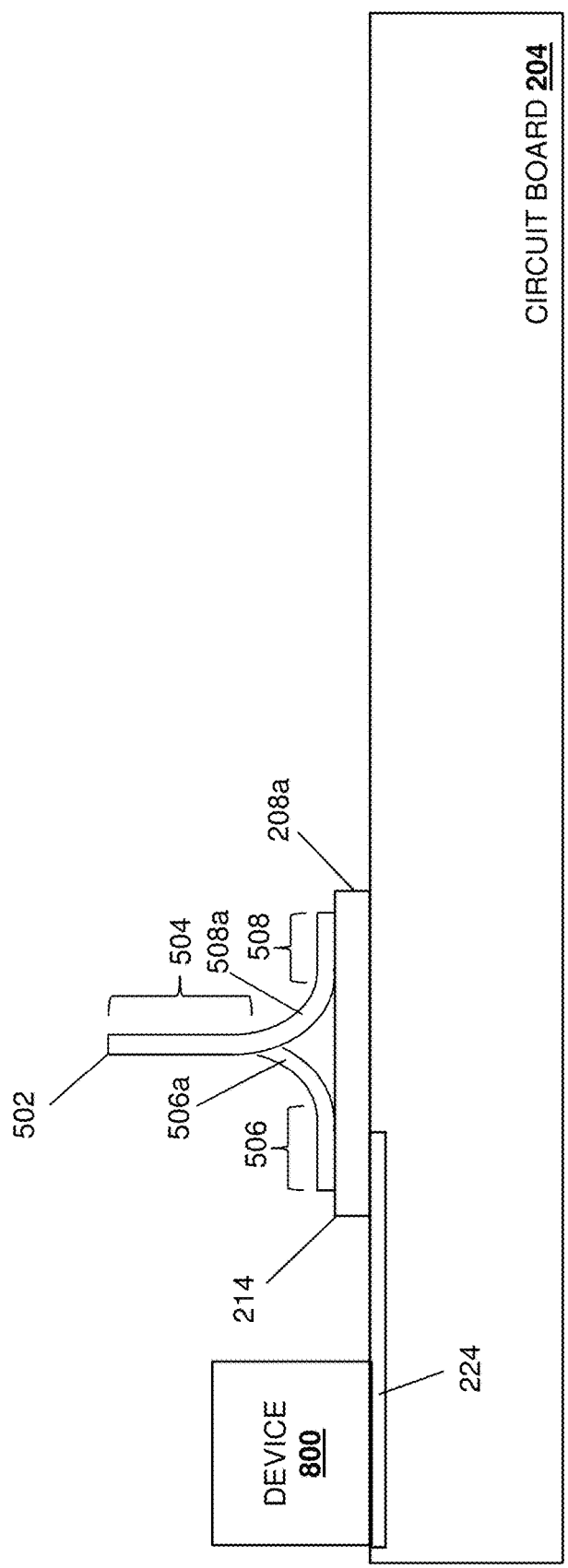
FIG. 8 is a schematic cross-sectional view illustrating an embodiment of the connector of FIGS. 5A and 5B mounted to a connector pad.

The method 600 then proceeds to block 604 where a first mounting portion of a connector lead frame is mounted to the connector pad, as well as block 606 where a second mounting portion of a connector lead frame is mounted to the connector pad. In the embodiment illustrated in FIG. 7, at blocks 604 and 606, the connector lead frame 502 of the connector 500 may be mounted to the connector pad 208 by mounting the first mounting portion 506 and the second mounting portion 508 of the connector lead frame 502 to the connector pad 208. Similarly, in the embodiment illustrated in FIG. 8, at blocks 604 and 606, the connector lead frame 502 of the connector 500 may be mounted to the connector pad 214 by mounting the first mounting portion 506 and the second mounting portion 508 of the connector lead frame 502 to the connector pad 214. As will be appreciated by one of skill in the art in possession of the present disclosure, the first mounting portion 506 and the second mounting portion 508 of the connector lead frame 502 may be mounted to any connector pad using soldering techniques and/or other mounting techniques while remaining within the scope of the present disclosure. Furthermore, as can be seen in FIGS. 7 and 8, the symmetrical cross section of the connector 500/connector lead frame 502 renders the orientation in which the connector 500/connector lead frame 502 is mounted to the connector pad 500 irrelevant (e.g., as compared to the conventional connectors/connector lead frames discussed above.)

The method 600 then proceeds to block 608 where a connection to a lead portion of the connector lead frame is provided. As can be seen in FIGS. 7 and 8, the mounting of the first mounting portion 506 and the second mounting portion 508 of the connector lead frame 502 to the connector pads 208 and 214, respectively, provides the lead portion 504 in a substantially perpendicular orientation relative to the connector pad 208, with the first mounting portion 506 and the second mounting portion 508 of the connector lead frame 502 orientated substantially perpendicularly to the lead portion 504. As discussed above, the connector lead frame 502 may be part of a connector subsystem (e.g., an SMT connector) that provides a coupling to a connector pad, and one of skill in the art in possession of the present disclosure will recognize that the substantial perpendicularity of the lead portion 504 relative to the first and second mounting portions 506 and 508 on the connector lead frame 502 discussed above may be provided in any portion of that connector subsystem that provides an electrical connection between 1) the surfaces of the first and second mounting portions 506 and 508 on the connector lead frame 502 that are mounted to the connector pad, and 2) the remainder of that connector subsystem. As such, strict perpendicularity may not be required as long as signals can be transmitted from the surfaces of the first and second mounting portions 506 and 508 on the connector lead frame 502 to the remainder of that connector subsystem. As such, in an embodiment of block 608, a connection to the lead portion 504 of the connector lead frame 502 in either of the embodiments illustrated in FIGS. 7 and 8 may be provided, which provides a coupling to the devices 700 and 800, respectively.

Following block 608, signals may be transmitted with the devices 700 and/or 800 via the connector 500, connectors pads 208 and/or 214, and signal transmission lines 220 and/or 224. With reference to FIG. 7, the first mounting portion 506 (and possibly some of the arcuate portion 506a) on the connector lead frame 502 provides a relatively shorter open portion of a signal transmission path (i.e., as compared to the conventional connector system discussed above with reference to FIG. 2E), and has been found to eliminate the introduction of resonance in response to the transmission of high speed signals via the connector 500, connectors pad 208, and signal transmission line 220. Similarly, with reference to FIG. 8, the second mounting portion 508 (and possibly some of the arcuate portion 508a) on the connector lead frame 502 provides a relatively shorter open portion of a signal transmission path (i.e., as compared to the conventional connector system discussed above with reference to FIG. 2E), and has been found to eliminate the introduction of resonance in response to the transmission of high speed signals via the connector 500, connectors pad 214, and signal transmission line 224. As such, the transmission of high speed signals via the connector lead frame 502 and the positive pads 208/214 in will produce an eye diagram similar to the eye diagram 300 illustrated in FIG. 3A, as well as an insertion loss chart 400 with insertion losses similar to those marked as "A" in FIG. 400.

With reference to FIG. 9, an embodiment of the conventional connector 228 with its connector lead frame 230 coupled to a conventional connector pad 900 is illustrated adjacent the connector 500 of the present disclosure with its connector lead frame 502 coupled to a conventional connector pad 902. In some examples, the connector 500 of the present disclosure may be provided on a circuit board (e.g., the circuit board 204) with conventional connector(s) 228 to, for example, provide connector pad connections for communication channels that transmit relatively high speed signals (e.g., the connector(s) 500 may be utilized for relatively higher speed signals transmitted via the circuit board, while the conventional connector(s) 228 may be utilized for relatively lower speed signals transmitted via the circuit board.) The embodiment illustrated in FIG. 9 is also provided to illustrate just a few other benefits of the systems and methods of the present disclosure.

For example, FIG. 10 illustrates the conventional connector 228 with its connector lead frame 230 coupled to a conventional connector pad 900, as well as a connector that is provided according to the teachings of the present disclosure but that includes a first mounting portion 1000 and a second mounting portion 1002 replacing the first and second mounting portions 506 and 508 discussed above with reference to FIGS. 5A-C. The first mounting portion 1000 and a second mounting portion 1002 on the connector lead frame 502 are mounted to a connector pad 1004, which utilizes less area on a circuit board (e.g., the circuit board 204) relative to the conventional connector pad 900. It has been found that the difference in structure between the conventional connector 228 and the connectors of the present disclosure allows the provisioning of relatively short mounting portions on the connector lead frame (e.g., the first mounting portion 1000 and the second mounting portion 1002 illustrated in FIG. 10, as compared to the mounting portion 236 on the conventional connector 228) that provide for mounting to the connector pads, while maintaining the equivalent or sufficient mechanical/structural strength to ensure that the connector does not disengage the connector pad 1004. In experimental embodiments, reductions in length of the mounting portion/portions (e.g., the length of the mounting portion 236 relative to the combined length of the mounting portions 100 and 1002) have been 50% or more. In another example, FIG. 11 illustrates the conventional connector 228 with its connector lead frame 230 coupled to a conventional connector pad 900, as well as the connector 500 with its connector lead frame 502 coupled to a connector pad 1100. As will be appreciated by one of skill in the art in possession of the present disclosure, the connector 500 allows material to be removed from the connector pad 1100 (e.g., relative to the connector pad 900) while still providing for the mounting of the connector 500 to the connector pad 1100, thus providing for cheaper and more efficient circuit board manufacture.

Thus, systems and methods have been described that provide a connector that may be mounted to a connector pad in either of two orientations without regard to the side of the connector pad from which the signal transmission line extends, and without creating an open portion of a signal transmission path that acts as a resonator that will compromise the signal integrity of the communication channel created by that connector. The connectors of the present disclosure include a connector lead frame having a lead portion that is substantially perpendicular to first and second mounting portions on the connector lead frame, with those first and second mounting portions extending in substantially opposite directions to each other. The mounting portions of the connector lead frame provide for the mounting of the connector lead frame to the connector pad, and provide mechanical/structure retention that is comparable to that provided by the conventional mounting portion on a conventional connector lead frames, while reducing the length of any open portion of a signal transmission path that can introduce resonance that reduces signal integrity. The ability to mount the connector to the connector pad in such a manner eliminates issues associated with circuit boards that have constrained routing issues, as the signal transmission lines may extend from either side of the connector pad without regard to issues that may result if the connector is mounted to that connector pad in an undesirable orientation. The reduction in length of the first and second mounting portions of the connector lead frame of the present disclosure (i.e., relative to a conventional mounting portion on a connector lead frame) provides for corresponding reductions in the area needed for the connector pad, thus providing for efficiencies in circuit board manufacture and cost.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A circuit board pad connector system, comprising:
a connector pad that is included on a circuit board, wherein the connector pad includes at least one of a first end or a second end having a first width that is less than a second width of the connector pad, and wherein the second end of the connector pad is opposite the connector pad from the first end;
a transmission line that extends from only the first end of the connector pad, wherein the transmission line is the only transmission line that extends from the connector pad; and
a connector that is mounted to the connector pad, wherein the connector includes:
a connector lead frame;
a lead portion that is provided on the connector lead frame such that the lead portion is oriented substantially perpendicularly relative to the connector pad when the connector is mounted to the connector pad;
a first mounting portion that is provided on the connector lead frame such that the first mounting portion extends in a first direction that is substantially perpendicular relative to the lead portion, wherein the first mounting portion includes a first length, and wherein the first mounting portion mounts the connector to the connector pad adjacent the second end of the connector pad; and
a second mounting portion that is provided on the connector lead frame such that the second mounting portion extends in a second direction that is different than the first direction and that is substantially perpendicular relative to the lead portion, wherein the second mounting portion includes a second length that is greater than the first length, and wherein the second mounting portion mounts the connector to the connector pad such that the second mounting portion is adjacent the first end of the connector pad.

2. The system of claim 1, further comprising:
a first arcuate portion that is provided on the connector lead frame and that extends between the lead portion and the first mounting portion; and
a second arcuate portion that is provided on the connector lead frame and that extends between the lead portion and the second mounting portion.

3. The system of claim 1, wherein the second direction in which the second mounting portion extends from the connector lead frame is substantially 180 degrees opposite the first direction in which the first mounting portion extends from the connector lead frame.

4. An Information Handling System (IHS), comprising:
a board;
a device coupled to the board;
a first connector pad that is located on the board and that is coupled to the device via a transmission line that extends from only a first end of the first connector pad, wherein the transmission line is the only transmission line that extends from the first connector pad, and wherein the first connector pad includes at least one of the first end or a second end having a first width that is less than a second width of the first connector pad, and wherein the second end is opposite the first connector pad from the first end; and
a connector that is mounted to the first connector pad, wherein the connector includes:
a connector lead frame;
a lead portion that is provided on the connector lead frame such that the lead portion is oriented substantially perpendicularly relative to the first connector pad;
a first mounting portion that mounts the connector to the first connector pad adjacent the second end of the first connector pad, wherein the first mounting portion includes a first length and is provided on the connector lead frame such that the first mounting portion extends in a first direction that is substantially perpendicular relative to the lead portion; and
a second mounting portion that mounts the connector to the first connector pad adjacent the first end of the first connector pad, wherein the second mounting portion is provided on the connector lead frame such that the second mounting portion extends in a second direction that is different than the first direction and that is substantially perpendicular relative to the lead portion, and wherein the second mounting portion includes a second length that is greater than the first length.

5. This IHS of claim 4, wherein the connector includes:
a first arcuate portion that is provided on the connector lead frame and that extends between the lead portion and the first mounting portion; and
a second arcuate portion that is provided on the connector lead frame and that extends between the lead portion and the second mounting portion.

6. This IHS of claim 4, wherein the second direction in which the second mounting portion extends from the connector lead frame is substantially 180 degrees opposite the first direction in which the first mounting portion extends from the connector lead frame.

7. This IHS of claim 4, wherein the connector is a Surface Mount Technology (SMT) connector.

8. This IHS of claim 4, further comprising:
a second connector pad that is located on the board and that utilizes a second connector pad area on the board, wherein the first connector pad utilizes a first connector pad area on the board that is smaller than the second connector pad area.

9. A method for providing a connector on a circuit board pad; comprising:
providing a board that is coupled to a device and that includes a first connector pad that is coupled to the device via a transmission line that extends from only a first end of the first connector pad, wherein the transmission line is the only transmission line that extends from the first connector pad, wherein the first connector pad includes at least one of the first end or a second end having a first width that is less than a second width of the first connector pad, wherein the second end of the first connector pad is opposite the first connector pad from the first end;

mounting a first mounting portion that is provided on a connector lead frame to the first connector pad adjacent the second end the first connector pad, wherein the first mounting portion includes a first length and extends from the connector lead frame in a first direction; and mounting a second mounting portion that is provided on the connector lead frame to the first connector pad adjacent the first end of the first connector pad, wherein the second mounting portion extends from the connector lead frame in a second direction that is different than the first direction and includes a second length that is greater than the first length of the first mounting portion, and wherein the mounting of the first mounting portion and the second mounting portion of the connector lead frame to the first connector pad orients a lead portion that is provided on the connector lead frame substantially perpendicularly relative to the first connector pad.

10. The method of claim 9, wherein a first arcuate portion is provided on the connector lead frame and extends between the lead portion and the first mounting portion, and wherein a second arcuate portion is provided on the connector lead frame and extends between the lead portion and the second mounting portion.

11. The method of claim 9, wherein the second direction in which the second mounting portion extends from the connector lead frame is substantially 180 degrees opposite the first direction in which the first mounting portion extends from the connector lead frame.

12. The method of claim 9, wherein the connector is a Surface Mount Technology (SMT) connector.

13. The method of claim 9, wherein a second connector pad is located on the board and utilizes a second connector pad area on the board, and wherein the first connector pad utilizes a first connector pad area on the board that is smaller than the second connector pad area.

* * * * *